United States Patent
Kawai

(10) Patent No.: US 10,734,989 B2
(45) Date of Patent: Aug. 4, 2020

(54) ELECTRONIC CIRCUIT

(71) Applicant: KABUSHIKI KAISHA TOSHIBA, Minato-ku (JP)

(72) Inventor: Shusuke Kawai, Fujisawa (JP)

(73) Assignee: KABUSHIKI KAISHA TOSHIBA, Minato-ku (JP)

( * ) Notice: Subject to any disclaimer, the term of this patent is extended or adjusted under 35 U.S.C. 154(b) by 0 days.

(21) Appl. No.: 16/286,989

(22) Filed: Feb. 27, 2019

(65) Prior Publication Data

US 2020/0091907 A1 Mar. 19, 2020

(30) Foreign Application Priority Data

Sep. 14, 2018 (JP) .................................. 2018-172636

(51) Int. Cl.
*H03K 17/0812* (2006.01)
*H03K 17/687* (2006.01)
*H03K 17/08* (2006.01)

(52) U.S. Cl.
CPC ... *H03K 17/08122* (2013.01); *H03K 17/6872* (2013.01); *H03K 2017/0806* (2013.01); *H03K 2017/6878* (2013.01)

(58) Field of Classification Search
CPC ......... H03K 17/08122; H03K 17/6782; H03K 2017/6878; H03K 2017/0806
USPC ......................................... 327/108, 371, 378
See application file for complete search history.

(56) References Cited

U.S. PATENT DOCUMENTS

2013/0147523 A1* 6/2013 Deboy ................. H03K 17/166 327/108

OTHER PUBLICATIONS

Denk, M et al., "An IGBT Driver Concept with Integrated Real-Time Junction Temperature Measurement", PCIM 2014, pp. 214-221.
Brandelero, J et al., "On-line Virtual Junction Temperature Measurement via DC Gate Current Injection", 10th International Conference on Integrated Power Electronics Systems, CIPS 2018, pp. 423-429.

* cited by examiner

*Primary Examiner* — John W Poos
(74) *Attorney, Agent, or Firm* — Oblon, McClelland, Maier & Neustadt, L.L.P.

(57) ABSTRACT

According to one embodiment, an electronic circuit includes a plurality of first transistors, a control circuit, a sample hold circuit and a calculation circuit. The control circuit selectively performs a first operation and a second operation, the first operation supplying a driving control signal to a gate terminal of a semiconductor switching element using the plurality of first transistors, and the second operation supplying a pulse current for measurement to the gate terminal using part of the plurality of first transistors. The sample hold circuit samples a voltage of the gate terminal during a period in which the pulse current is supplied to the gate terminal in the second operation. The calculation circuit calculates a gate resistance of the semiconductor switching element based on the sampled voltage.

19 Claims, 13 Drawing Sheets

ELECTRONIC CIRCUIT

CROSS-REFERENCE TO RELATED APPLICATIONS

This application is based upon and claims the benefit of priority from Japanese Patent Application No. 2018-172636 filed on Sep. 14, 2018; the entire contents of which are incorporated herein by reference.

FIELD

Embodiments described herein relates to an electronic circuit.

BACKGROUND

A life of a semiconductor switching element with high breakedown voltage can be predicted by detecting a junction temperature of the semiconductor switching element. A gate resistance of the semiconductor switching element is increased along with an increase in a temperature of the semiconductor switching element. Accordingly, when the gate resistance of the semiconductor switching element is detected, the temperature of the semiconductor switching element is estimated, thereby enabling the life of the semiconductor switching element to be predicted.

There is a technique of inputting a sine wave current to a gate terminal of the semiconductor switching element to detect a gate voltage, and calculating a gate resistance based on the detected gate voltage. The influence of parasitic inductor and parasitic capacitor can be ignored by inputting the sine wave current having the same frequency as the resonant frequency determined by the parasitic inductor and the parasitic capacitor of a gate electrode. The voltage across the gate resistance is amplified to convert the amplified voltage into a DC (Direct Current) voltage by a detection circuit, and the DC voltage is further amplified, whereby the voltage across the gate resistance is read. The value of the gate resistance can be calculated based on the read voltage.

However, in this technique, it is necessary to measure a gate parasitic inductance in advance, which makes the process cumbersome. Furthermore, a circuit configured to input a sine wave current is additionally needed, thereby causing a circuit area to be increased.

There is also a technique of inputting a pulse current to the gate terminal of the semiconductor switching element with high breakdown voltage. In this technique, a gate voltage having a trapezoid wave is measured at two points of time, such a gate voltage being generated due to the parasitic capacitor and the parasitic resistance, and is AD-converted. Both of the gate resistance and the input current are calculated based on the AD-converted voltage. In this technique, if the parasitic capacitor of the semiconductor switching element is known, the gate resistance can be calculated even when a current value of the pulse current is unknown.

However, in this technique, since the gate voltage detected at two points of time need to be directly AD-converted, an ADC (Analog to Digital Converter) with high effective resolution is needed to improve the calculation accuracy of the gate resistance value. Furthermore, a circuit configured to input a current is additionally needed, thereby causing a circuit area to be increased.

DETAILED DESCRIPTION

According to one embodiment, an electronic circuit includes a plurality of first transistors, a control circuit, a sample hold circuit and a calculation circuit.

The control circuit selectively performs a first operation and a second operation, the first operation supplying a driving control signal to a gate terminal of a semiconductor switching element using the plurality of first transistors, and the second operation supplying a pulse current for measurement to the gate terminal using part of the plurality of first transistors.

The sample hold circuit samples a voltage of the gate terminal during a period in which the pulse current is supplied to the gate terminal in the second operation.

The calculation circuit calculates a gate resistance of the semiconductor switching element based on the sampled voltage.

Hereinafter, embodiments of the present invention will be described with reference to drawings.

First Embodiment

Figure 1:
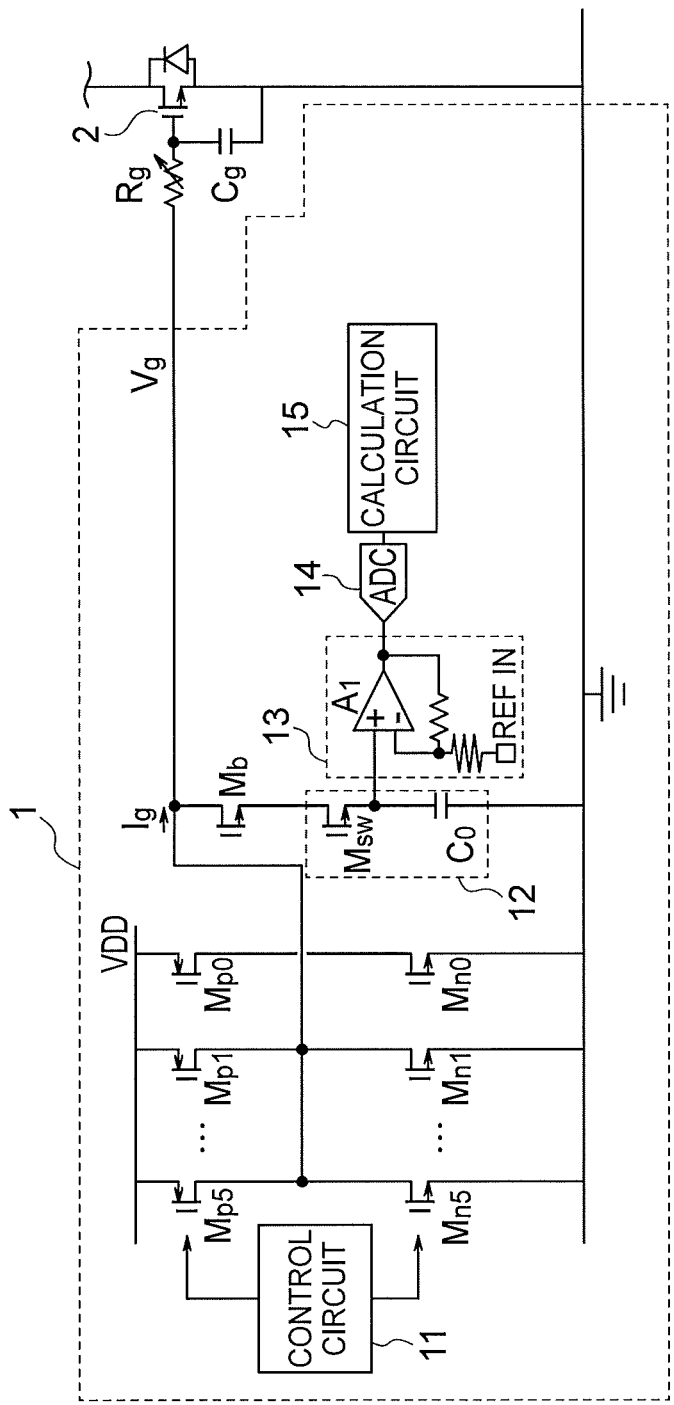
FIG. 1 is a diagram illustrating an electronic circuit according to a first embodiment.

FIG. 1 is a drive system including an electronic circuit according to the present embodiment. The drive system includes an electronic circuit 1 and a semiconductor switching element 2.

The semiconductor switching element 2 is a semiconductor element with high voltage resistance that is switched between an ON state and an OFF state by a control signal (for example, a control voltage) supplied from the electronic circuit 1. In the present embodiment, the semiconductor switching element 2 is a high breakdown voltage power MOS transistor. The semiconductor switching element 2 includes a parasitic resistance Rg, a parasitic capacitor Cg, and a parasitic inductor Lg as parasitic components. FIG. 1 only illustrates the parasitic resistance Rg and the parasitic capacitor Cg. The high breakdown voltage power MOS transistor is exemplary, and the semiconductor switching element 2 may be any other type of element. For example, the semiconductor switching element 2 may be an IGBT (Insulated Gate Bipolar Transistor), a thyristor, or the like, or may be an element using a compound semiconductor such as SiC (silicon carbide), GaN (gallium nitride), or the like. The electronic circuit 1 controls ON/OFF of the semiconductor switching element 2 to thereby drive a load (not illustrated) connected to the semiconductor switching element 2. When the semiconductor switching element 2 is turned on, a current is supplied to the load. Examples of the load include motors of air conditioners, refrigerators, trains, robots, and the like, and PFC (Power Factor Correction) circuits for server power supplies, and the like.

The electronic circuit 1 includes n+1 PMOS transistors Mpx ("x" takes a value from 0 to n, and "n" is an integer equal to or greater than 1), and N+1 NMOS transistors Mnx ("x" takes a value from 0 to n, and "n" is an integer equal to or greater than 1). In FIG. 1, as n=5, the electronic circuit 1 includes six PMOS transistors Mp0 to Mp5, and six NMOS transistors Mn0 to Mn5. The PMOS transistor Mpx and the NMOS transistor Mnx are connected in series, a source terminal (hereinafter referred to as a "source") of the PMOS transistor Mpx is connected to a power supply voltage VDD, and a source terminal of the NMOS transistor Mnx is connected to a reference voltage (ground). For x=0 to n, the drain terminal of the PMOS transistor Mpx and the drain terminal of the NMOS transistor Mnx (hereinafter referred to as a "drain") are connected to each other. The PMOS transistor Mpx corresponds to a first transistor, and the NMOS transistor Mnx corresponds to a second transistor.

The electronic circuit 1 includes a control circuit 11, a sample hold circuit 12, an NMOS transistor Mb, an amplification circuit 13, an ADC (Analog to Digital Converter) 14, and a calculation circuit 15. The electronic circuit 1 is configured, for example, as one chip, and a gate terminal (hereinafter, simply referred to as a "gate") of the semiconductor switching element 2 is connected to the terminal of the chip.

The control circuit 11, the PMOS transistors Mp0 to Mp5, and the NMOS transistors Mn0 to Mn5 correspond to a drive circuit (gate drive circuit) of the semiconductor switching element 2. The control circuit 11, some of the PMOS transistors Mp0 to Mp5, some of the NMOS transistors Mn0 to Mn5, a PMOS transistor Mpb, the sample hold circuit 12, the NMOS transistor Mb, the amplification circuit 13, the ADC 14, and the calculation circuit 15 correspond to a measurement circuit configured to measure a gate resistance and a temperature (junction temperature) of the semiconductor switching element 2. Some of the above-described PMOS transistors Mp0 to Mp5 and some of the above-described NMOS transistors Mn0 to Mn5 are shared by both of the drive circuit and the measurement circuit.

The control circuit 11 selectively performs a first operation to supply a driving control signal to the gate terminal of the semiconductor switching element 2 using the PMOS transistors Mp0 to Mp5, and a second operation to supply a pulse current for measurement to the gate terminal using some of the PMOS transistors Mp0 to Mp5.

As the above-described first operation, the control circuit 11 controls the PMOS transistors Mp0 to Mp5 and the NMOS transistors Mn0 to Mn5 in a driving period of the semiconductor switching element 2 to drive the semiconductor switching element 2. The control circuit 11 controls the PMOS transistor Mp0 and the NMOS transistor Mn0 by the control voltages to be supplied to the respective gates.

Figure 2:
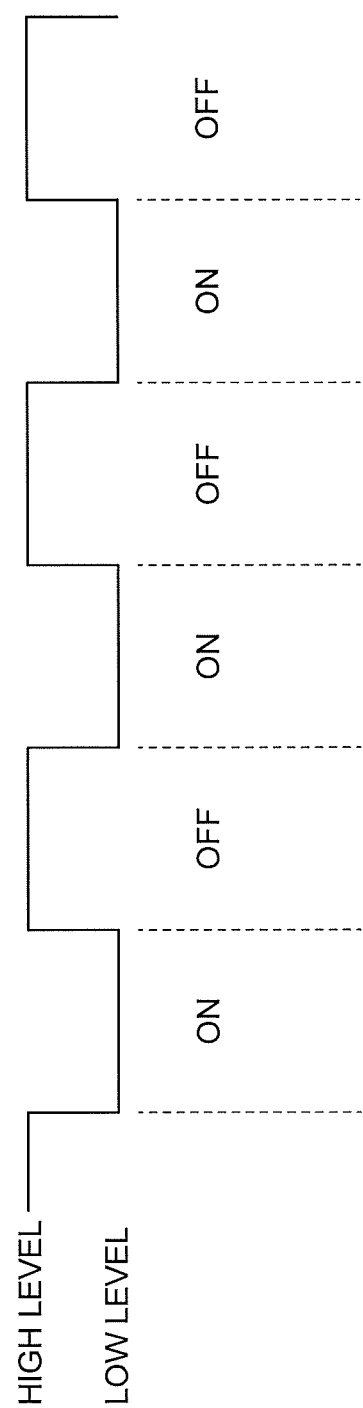
FIG. 2 is a graph showing an exemplary control voltage to be supplied to a transistor, and exemplary on and off periods of a semiconductor switching element.

FIG. 2 is a graph showing an exemplary control voltage supplied to the PMOS transistors Mp0 to Mp5 and the NMOS transistors Mn0 to Mn5. These transistors are supplied with the same control voltage. Since a low-level voltage is supplied to these transistors during a driving period (a period of "ON" in FIG. 2) of the semiconductor switching element 2, the PMOS transistors Mp0 to Mp5 are turned on and the NMOS transistors Mn0 to Mn5 are turned off. In this way, the control voltage (gate voltage) for driving the semiconductor switching element 2 is supplied to the gate of the semiconductor switching element 2. Since this gate voltage is larger than a threshold voltage of the semiconductor switching element 2, the semiconductor switching element 2 is turned on. Since a high-level voltage is supplied to the PMOS transistors Mp0 to Mp5 and the NMOS transistors Mn0 to Mn5 during a non-driving period (a period of "OFF" in FIG. 2) of the semiconductor switching element 2, the PMOS transistors Mp0 to Mp5 are turned off and the NMOS transistors Mn0 to Mn5 are turned on. In this way, the gate voltage of the semiconductor switching element 2 is less than the threshold voltage, and then the semiconductor switching element 2 is turned off. By way of example, the control circuit 11 controls the driving of the semiconductor switching element 2 so that the driving period and the non-driving period are alternately repeated at a predetermined switching period.

In the present embodiment, a measurement process of measuring the gate resistance and the temperature (junction temperature) of the semiconductor switching element 2 is performed during the non-driving period (off period) of the semiconductor switching element 2. As the second operation (to supply a pulse current for measurement to the gate terminal using some of the PMOS transistors Mp0 to Mp5), the pulse current for measurement is input to the gate of the semiconductor switching element 2 in a first off period. The gate voltage is measured at a time (t1) after the elapse of a first period from a time (0) at which the pulse current for measurement is input. In a second off period which follows the first off period, the pulse current for measurement is similarly input to the gate of the semiconductor switching element 2 as the second operation. The gate voltage is measured at a time (time t2) after the elapse of a second period from the time (0) at which the pulse current for measurement is input. A gate resistance is calculated based on the gate voltages measured at the times t1 and t2, and the temperature of the semiconductor switching element 2 is calculated based on the gate resistance.

The control circuit 11 controls the PMOS transistors Mp0 to Mp5 and the NMOS transistors Mn0 to Mn5 to generate the pulse current during the measurement period when the start timing (time 0) of the measurement process is reached in each of the first off period and the second off period. The start timing of the measurement process is a time after a predetermined period from the start of the off period, for example. During the off period, the PMOS transistors Mp0 to Mp5 are normally in off state, and the NMOS transistors Mn0 to Mn5 are normally in on state. In the measurement process, during the measurement period during which the pulse current is generated, at least one of the PMOS transistors Mpx (x is any one of 0 to n) is turned on, and the NMOS transistors Mn0 to Mn5 are turned off. For the sake of illustration, one PMOS transistor Mp0 is turned on, and the NMOS transistors Mn0 to Mn5 are turned off. In this way, the one PMOS transistor Mp0 which has been turned on functions as a pulse current source, and the pulse current is generated during a period in which the one PMOS transistor Mp0 is turned on. The generated pulse current is output from the PMOS transistor Mp0. This pulse current flows, as a gate current Ig, in a direction from a connection node between the PMOS transistor Mp0 and the NMOS transistor Mn0 to the gate of the semiconductor switching element 2. Note that when the measurement period is completed, the PMOS transistor Mp0 may be turned back off and all of the NMOS transistors may be turned on.

The amount of pulse current can be controlled by the number of PMOS transistors Mpx to be turned on. Accordingly, the number of PMOS transistors Mpx to be turned on may be adjusted in accordance with the characteristics of the semiconductor switching element. Note that if the number of PMOS transistors to be turned on is increased more than necessary, a voltage equal to or higher than the threshold voltage is supplied to the gate, resulting in the semiconductor switching element 2 being turned on. Therefore, the number of PMOS transistors to be turned on shall satisfy the condition that the voltage to be supplied to the gate does not exceed the threshold voltage of the semiconductor switching element 2. In this way, the gate resistance can be detected with high accuracy regardless of the threshold voltage of the semiconductor switching element and the gate resistance value.

Figure 3:
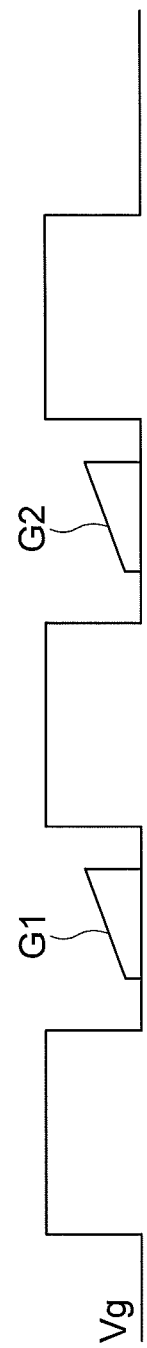
FIG. 3 is a graph showing an exemplary gate voltage of the semiconductor switching element.

FIG. 3 is a graph showing an exemplary signal of the gate voltage when a pulse current is input in each of the first off period (for example, the first off period in FIG. 2) and the second off period (for example, the second off period in FIG. 2). Usually, the gate voltages G1 and G2 having trapezoid wave are generated by input of the pulse current in a section in which the gate voltage is at the low level. The trapezoid wave is caused by the parasitic resistance and the parasitic capacitor. Since these voltages G1 and G2 each are less than the threshold of the semiconductor switching element 2, the semiconductor switching element 2 remains in an off state even when each of the voltages G1 and G2 is applied to the gate.

Figure 4:
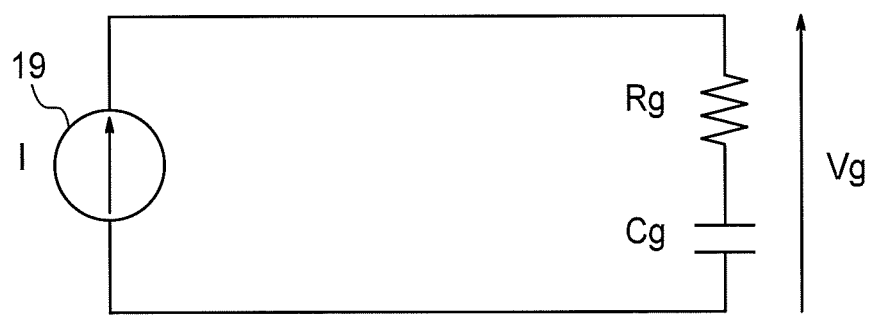
FIG. 4 is a diagram illustrating an exemplary equivalent circuit including a current source and parasitic components (a gate resistance and a parasitic capacitor)

FIG. 4 is an equivalent circuit diagram including a pulse current source 19, a gate resistance Rg, and a parasitic capacitor Cg. The pulse current source 19 corresponds to the PMOS transistor which is turned on as a current source. The gate voltage Vg corresponds to a voltage applied to both of the gate resistance Rg and the parasitic capacitor Cg.

In the present embodiment, the PMOS transistor Mp0 is used as a part of the drive circuit of the semiconductor switching element 2 (a driving operation of the semiconductor switching element), and is also used as a current source which is a part of the measurement circuit (measurement process of the gate resistance and the temperature). That is, the PMOS transistor Mp0 is shared by the drive circuit and the measurement circuit. Therefore, it is not necessary to additionally provide the path for inputting the pulse current, and the chip area can be reduced.

The drain of the NMOS transistor Mb is connected to the path (wiring) between the gate of the semiconductor switching element 2 and the connection node N between the PMOS transistor Mp0 and the NMOS transistor Mn0. The sample hold circuit 12 is connected to the source of the NMOS transistor Mb. The NMOS transistor Mb interrupts the sample hold circuit 12 from a drive system of the semiconductor switching element 2 when the semiconductor switching element 2 is driven (i.e., during a normal operation). The PMOS transistor Mp0 is turned off during the on period of the semiconductor switching element 2, and is turned on during the measurement process (at least during a period in which the pulse current is input). The PMOS transistor Mp0 is controlled by the control circuit 11, but may be controlled by another circuit not illustrated.

The sample hold circuit 12 includes an NMOS transistor Msw and a capacitor C0. The drain of the NMOS transistor Msw is connected to the source of the NMOS transistor Mb. The source of the NMOS transistor Msw is connected to one end of the capacitor C0. The other end of the capacitor C0 is connected to a reference voltage terminal (ground terminal). The gate of the NMOS transistor Msw is connected to the control circuit 11 so that a trigger signal for a sampling is applied from the control circuit 11. The trigger signal has a voltage equal to or higher than a threshold voltage of the NMOS transistor Msw. The gate voltages (see G1 and G2 in FIG. 3) each which are generated at the gate in response to the pulse current are input to the sample hold circuit 12 during a period in which the NMOS transistor Mb is turned on. The sample hold circuit 12 measures (samples) the gate voltage at a timing at which the trigger signal is input from the control circuit 11. Here, the NMOS transistor Msw is controlled by the control circuit 11, but may be controlled by another circuit not illustrated.

Figure 5:
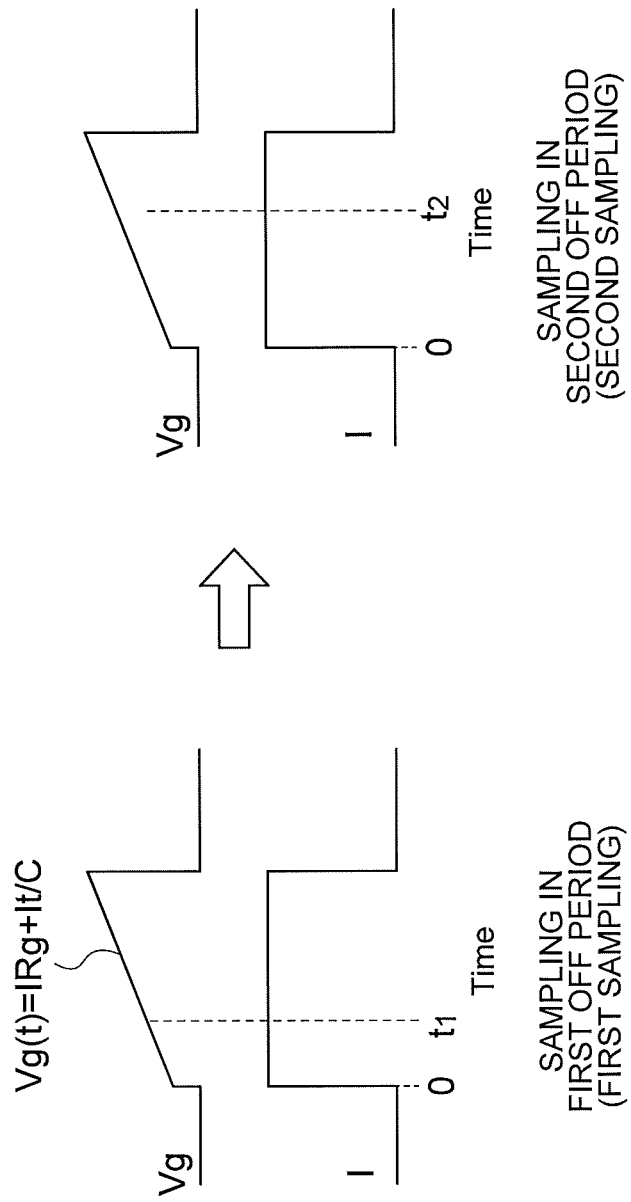
FIG. 5 is an explanatory graph of the operation according to the first embodiment.

FIG. 5 shows a specific example of the operation of the sample hold circuit 12. A graph on the left side of FIG. 5 shows a waveform of the pulse current which is input in the first off period, and a waveform of the corresponding gate voltage. The waveform of this gate voltage corresponds to the gate voltage G1 of FIG. 3. The sample hold circuit 12 measures the gate voltage (a first sampling) at the time t1 after the elapse of the first period from the start time (0) of the pulse.

A graph on the right side of FIG. 5 shows a waveform of the pulse current which is input in the second off period following the first off period, and the waveform of the corresponding gate voltage. The waveform of this gate voltage corresponds to the gate voltage G2 of FIG. 3. The sample hold circuit 12 measures the gate voltage (a second sampling) at the time t2 after the elapse of the second period from the start time (0) of the pulse. The second period is longer than the first period. Note that the first sampling time and the second sampling time should be different from each other, and the second period may be shorter than the first period. The control circuit 11 outputs a trigger signal at the above-described time t1 for the sampling (the first sampling) in the first off period, and a trigger signal at the above-described time t2 for the sampling (the second sampling) in the second off period.

The amplification circuit 13 is connected to the output terminal of the sample hold circuit 12, and the voltage sampled in the sample hold circuit 12 is amplified by an amplifier A1.

The ADC 14 converts the amplified voltage into a digital value by AD conversion, and outputs the digital value to the calculation circuit 15. Accordingly, a digital value (a first digital value) indicating a value determined by amplifying the voltage sampled in the first off period and a digital value (a second digital value) indicating a value determined by amplifying the voltage sampled in the second off period are input to the calculation circuit 15.

The calculation circuit 15 calculates a gate resistance Rg based on the first digital value and the second digital value which are input from the ADC 14, and a temperature Ts of the semiconductor switching element 2 based on the gate resistance Rg. The gate voltage Vg, the gate resistance Rg, and the input current (pulse current) I of the gate satisfy a relationship represented by the following equation (1). "C" represents a parasitic capacitance. "t" represents an elapsed time from the start time (0) of the pulse. The equation (1)

corresponds to a straight line sloping right upward from the time 0 in each of the left and right graphs showing the gate voltage in FIG. 5.

$$Vg = I \cdot Rg + I \cdot t/C \quad (1)$$

"I" and "Rg" are unknown variables. The gate voltage Vg (sampled gate voltage) and "t" are known values. One equation is created by substituting the first digital value into "Vg" and the time t1 into "t". Similarly, another one equation is created by substituting the second digital value into "Vg" and the time t2 into "t". Therefore, "I" and "Rg" can be calculated by solving simultaneous equations with two equations.

The temperature Ts of the semiconductor switching element 2 has a certain relationship with the gate resistance Rg. Once the gate resistance Rg is known, the temperature Ts of the semiconductor switching element 2 can be calculated. The information indicating the relationship between the temperature of the semiconductor switching element 2 and the gate resistance (information about the temperature and the resistance) is given in advance. The information about the temperature and the resistance may be defined in the form of mathematical equations or in the form of look-up table. The calculation circuit 15 calculates the temperature Ts of the semiconductor switching element 2 based on the calculated gate resistance Rg and the information about the temperature and the resistance. By way of example, the calculation circuit 15 may be comprised of a general purpose processor, a central processing unit (CPU), a microprocessor, a digital signal processor (DSP), a controller, a microcontroller, an application specific integrated circuit, a field programmable gate array (FPGA), a programmable logic device (PLD), or the like.

The calculation circuit 15 can perform an arbitrary operation using the calculated temperature Ts of the semiconductor switching element 2. For example, the calculation circuit 15 predicts the life of the semiconductor switching element 2, and the life of a system on which the semiconductor switching element 2 is mounted. The calculation circuit 15 may output the information indicating the temperature Ts to an external device not illustrated.

As described above, according to the present embodiment, the pulse current is input in each of a plurality of off periods, the gate voltage is sampled by the sample hold circuit at different timings, and the sampled voltage is amplified by the amplification circuit and then is AD-converted. Thus, the gate voltage needs not to be directly AD-converted, and therefore the required resolution of ADC can be reduced.

According to the present embodiment, the transistors Mpx and Mnx can be shared by the drive circuit and the measurement circuit, and therefore it is not necessary to additionally provide the path for inputting the pulse current. Therefore, the circuit area can be reduced.

According to the present embodiment, the measurement process is performed during the non-driving period of the semiconductor switching element 2, and therefore it is not necessary to stop the operation of the semiconductor switching element 2.

Second Embodiment

Figure 6:
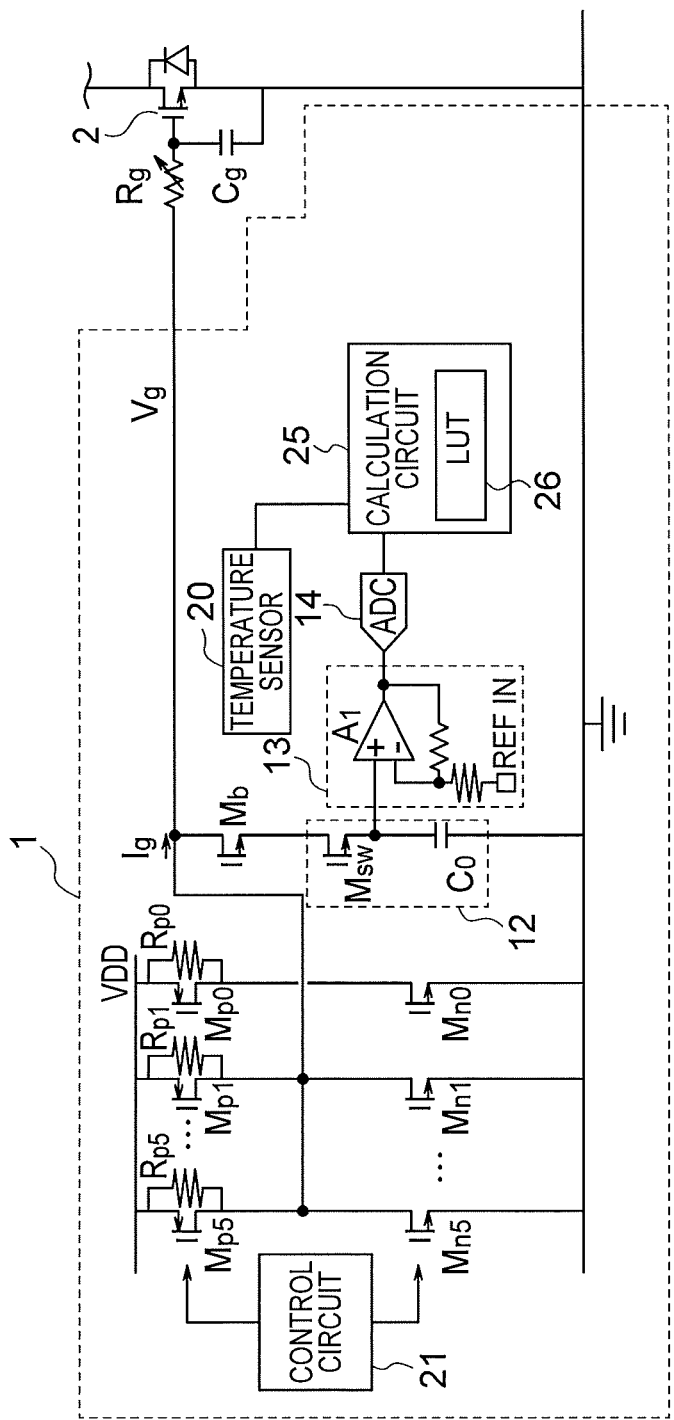
FIG. 6 is a diagram illustrating an electronic circuit according to a second embodiment.

FIG. 6 is a diagram illustrating an electronic circuit according to a second embodiment. The description about elements which are the same as or equivalent to those in FIG. 1 is omitted as appropriate except for an expanded operation and a changed operation.

The operation of a control circuit 21 is partially changed from the control circuit 11 of FIG. 1, a temperature sensor 20 is added, and the operation of a calculation circuit 25 is partially expanded from the calculation circuit 15 of FIG. 1. Although illustration is omitted in the first embodiment, output resistances Rp0 to Rp5 of the respective PMOS transistors Mp0 to Mp5 are illustrated in FIG. 6. The output resistances Rp0 to Rp5 may change depending on the temperature. By way of example, the output resistance is an output resistance when seen from the drain of the PMOS transistor.

In the first embodiment, the pulse current is generated and the gate voltage is measured in each of the two off periods. In contrast, in the second embodiment, the pulse current is generated and the gate voltage is measured only in one off period. That is, the control circuit 21 controls the transistors Mpx and Mnx so that the pulse current is generated only in one off period. The sample hold circuit 12 measures (samples) a gate voltage at a predetermined time in a period in which the pulse current is generated. That is, the control circuit 21 outputs a trigger signal to the sample hold circuit 12 at a predetermined time. The amplification circuit 13 amplifies a voltage measured by the sample hold circuit 12, and the ADC 14 determines a digital value by AD-converting the amplified voltage into a digital value. The determined digital value is input to the calculation circuit 25.

The temperature sensor 20 measures a temperature Tc (chip temperature) inside the electronic circuit 1, and outputs a value of the measured temperature Tc to the calculation circuit 25. A specific example of the temperature sensor 20 includes a diode. Note that the temperature Tc inside the electronic circuit 1 may be different from the temperature Ts of the semiconductor switching element 2 or may be the same as the temperature Ts of the semiconductor switching element 2. Accordingly, the temperature Ts of the semiconductor switching element 2 needs to be calculated separately from the temperature Tc inside the electronic circuit 1.

The calculation circuit 25 includes a look-up table (LUT) 26. The LUT 26 holds the chip temperature Tc and the value of the pulse current (gate current) in the manner in which they are associated with each other. As described above, the output resistance changes depending on the temperature, and the pulse current flowing in the gate changes depending on the temperature. Then, the relationship between the chip temperature and the value of the pulse current is determined by the experiment or the simulation in advance by changing the multiple chip temperatures while generating the pulse current having the same amplitude and time length. The information (information about the temperature and the current) indicating the association relationship between the determined chip temperature and gate current is stored in the LUT 26.

The calculation circuit 25 specifies the value of the pulse current based on the temperature Tc measured by the temperature sensor 20 and the LUT 26. The gate resistance Rg is determined by substituting the specified current value and the digital value (gate voltage Vg) input from the ADC 14 in the equation (1). Then, similarly to the first embodiment, the temperature Ts of the semiconductor switching element 2 is calculated based on the determined "Rg" and the above-described information about the temperature and the resistance.

According to the present embodiment, since the gate current (pulse current) is calculated based on the chip temperature, only one variable is unknown, and therefore the gate resistance and the temperature of the semiconductor switching element can be calculated only by a single sampling of the gate voltage. Also, even when there is an output resistance depending on the temperature, the gate current can be calculated with high accuracy by calculating the gate current using the chip temperature.

According to the present embodiment, the measurement process is performed during the non-driving period of the semiconductor switching element 2, and therefore it is not necessary to stop the operation of the semiconductor switching element 2.

Third Embodiment

Figure 7:
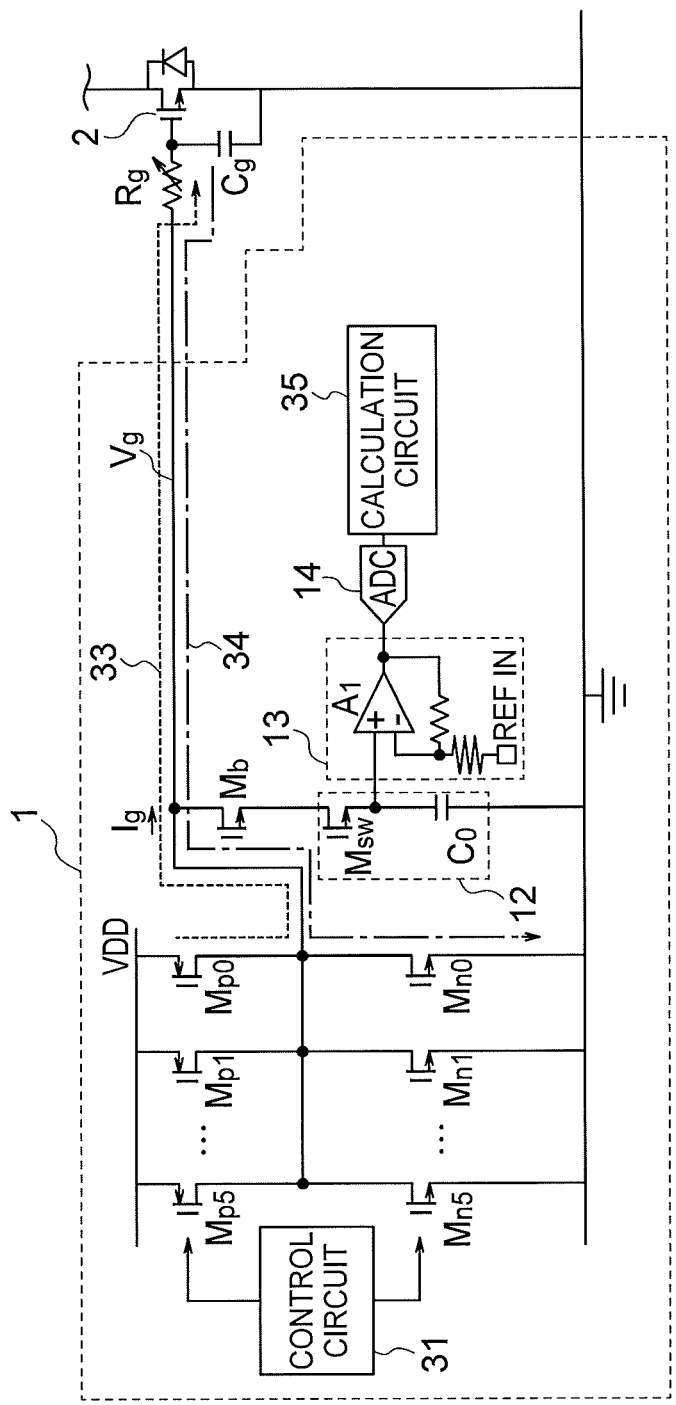
FIG. 7 is a diagram illustrating an electronic circuit according to a third embodiment.

FIG. 7 is a diagram illustrating an electronic circuit according to a third embodiment. The description about elements which are the same as or equivalent to those in FIG. 1 is omitted as appropriate except for an expanded operation and a changed operation.

The operation of a control circuit 31 is partially changed from the control circuit 11 of FIG. 1, and the operation of a calculation circuit 23 is partially expanded from the calculation circuit 15 of FIG. 1.

In the present embodiment, the presence of the output resistance (hereinafter referred to as a drain resistance) (see FIG. 6) when seen from the drain of the PMOS transistor Mpx used as a current source is taken into consideration to calculate the gate resistance. In the first embodiment, the number of unknown variables is two: "Rg" and "I", and the equation (1) with these variables is a linear function. Therefore, these variables can be calculated by solving the simultaneous equations. In contrast, when the drain resistance is considered as an unknown variable, the number of unknown variables is three: "Rg", "I", and "Rp0". Therefore, in the method of the first embodiment, these unknown variables cannot be calculated. The present embodiment provides a method of solving this problem.

Figure 8:
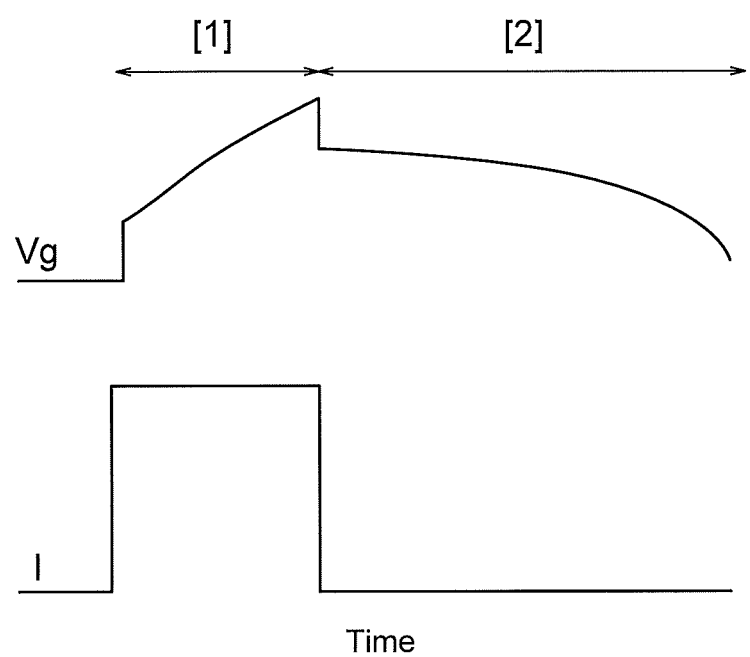
FIG. 8 is a graph for explaining outlines of the third embodiment.

FIG. 8 is a graph for explaining outlines of the present embodiment. As shown in the graph on the lower side of FIG. 8, the pulse current is input similarly to the first embodiment. At this time, the gate voltage is shown by a section [1] of the graph on the upper side of FIG. 8. Since there is a drain resistance Rd, the number of unknown variables is three. Therefore, the graph in the section [1] is not represented by a linear function.

Figure 9:
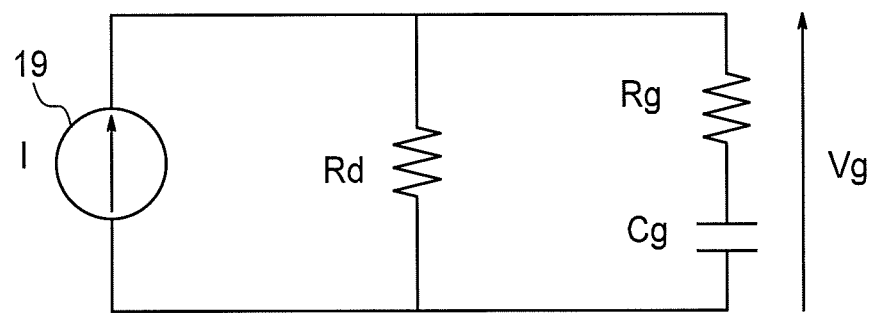
FIG. 9 is an equivalent circuit diagram including a pulse current source, an output resistance, and parasitic components (a gate resistance and a parasitic capacitor)

FIG. 9 is an equivalent circuit diagram including a pulse current source 19, a drain resistance Rd, a gate resistance Rg, and a parasitic capacitor Cg. The pulse current source 19 corresponds to the PMOS transistor which is turned on as a current source. The gate resistance Rg and the parasitic capacitor Cg are connected in series, and the drain resistance Rd in parallel to this combination of the gate resistance Rg and the parasitic capacitor Cg. When the pulse current source 19 inputs the pulse current, the gate voltage changes as shown in the section [1] of FIG. 8. Since the number of unknown variables is three: "Rg", "I", and "Rp0", all of these variables cannot be determined. In the present embodiment, the number of unknown variables is reduced to two: "Rd" and "Rg" and these two variables are determined by the following method.

In the section [1] of FIG. 8, the parasitic capacitor is charged with the gate voltage during input of the pulse current. The path 33 of FIG. 7 represents this charge. After the input of the pulse current is completed (for example, after the PMOS transistor Mp0 used as a current source is turned off), the NMOS transistor Mn0 corresponding to the PMOS transistor Mp0 operates in a linear region (the NMOS transistor Mn0 functions as an ON resistance), for example. The NMOS transistors other than the NMOS transistor operating in the linear region are turned off. Thus, the charge accumulated in the parasitic capacitor is discharged to the ground. A graph of a voltage in a section [2] of FIG. 8 and the path 34 of FIG. 7 represent this discharge. The voltage in the section [2] represents a transient response of the voltage at the time of discharging. Note that the NMOS transistor operating in the linear region (being turned on) is not necessarily limited to the NMOS transistor which is connected to the PMOS transistor used for input of the pulse current. The resistance value at the time of discharging can be controlled by adjusting the number of NMOS transistors Mnx operating in the linear region. The number of PMOS transistors used for the pulse current may be different from the number of NMOS transistors operating in the linear region at the time of discharging.

Figure 10:
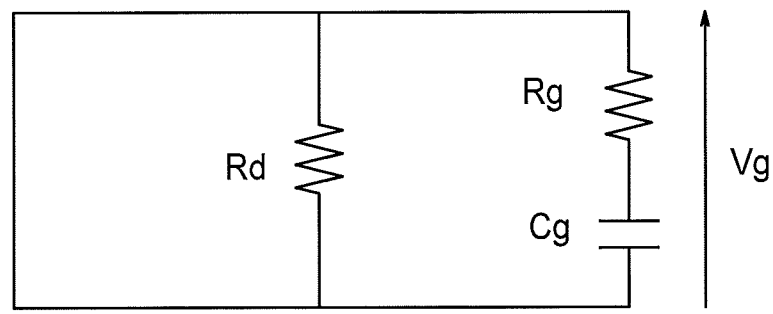
FIG. 10 is an equivalent circuit diagram including an output resistance at the time of discharging, and parasitic components (a gate resistance and a parasitic capacitor)

FIG. 10 is an equivalent circuit diagram including an on resistance (hereinafter referred to as an output resistance) Rd when seen from the drain of the NMOS transistor at the time of discharging, a gate resistance Rg, and a parasitic capacitor Cg. As compared to FIG. 9, FIG. 10 does not include the current source. The number of unknown variables is only two: "Rg" and "Rd". Therefore, "Rg" and "Rd" can be determined by measuring the gate voltage at the time of transient response in the section [2]. A more detailed description will be rendered by reference to FIG. 11 to FIG. 14.

FIG. 11 to FIG. 14 each are a diagram for explaining a specific example of a process of determining the gate resistance Rg and the drain resistance Rd.

Figure 11:
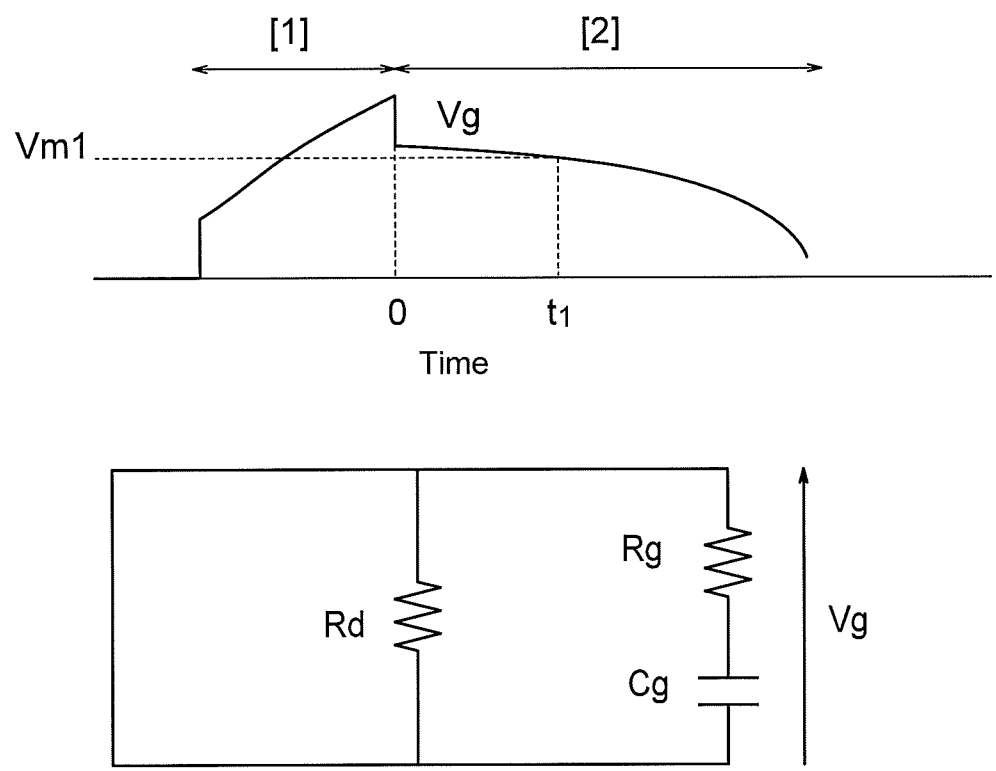
FIG. 11 is a diagram for explaining a specific example of a process of determining a gate resistance.

As shown in a graph on the upper side of FIG. 11, the two PMOS transistors (here, Mp0 and Mp1) are turned on and the pulse current is input in the first off period of the semiconductor switching element 2. After the input of the pulse current is completed, the corresponding NMOS transistors (here, Mn0 and Mn1) operate in a linear region to discharge the charge. The NMOS transistors other than Mn0 and Mn1 are turned off. A voltage Vm1 is measured at a first time (t1) after the elapse of a first period from the start time (0) of the discharge (a first sampling). The equivalent circuit at the time of discharging is illustrated on the lower side of FIG. 11. The drain resistance of the NMOS transistor at this time is Rd.

Figure 12:
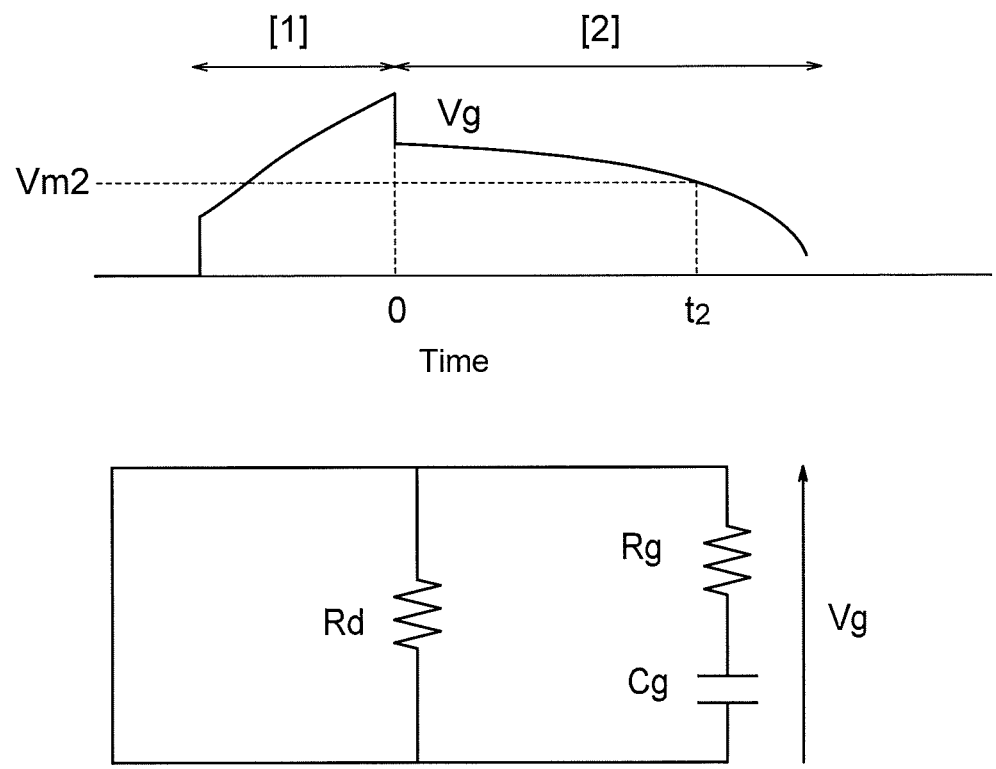
FIG. 12 is a diagram for explaining a specific example of a process of determining a gate resistance.

Similarly to the first off period, as shown in a graph on the upper side of FIG. 12, the two PMOS transistors (here, Mp0 and Mp1) are turned on and the pulse current is input in the second off period. After the input of the pulse current is completed, the corresponding NMOS transistors (here, Mn0 and Mn1) operate in a linear region to discharge the charge. The NMOS transistors other than Mn0 and Mn1 are turned off. A voltage Vm2 is measured at a second time (t2) after the elapse of a second period from the start time (time 0) of the discharge (a second sampling). The second period is longer than the first period. Note that the first period should be different from the second period, and the second period may be shorter than the first period. The equivalent circuit at the time of discharging is illustrated on the lower side of FIG. 12. Since the same PMOS transistors as the first sampling are used, the drain resistance at this time is also Rd.

Figure 13:
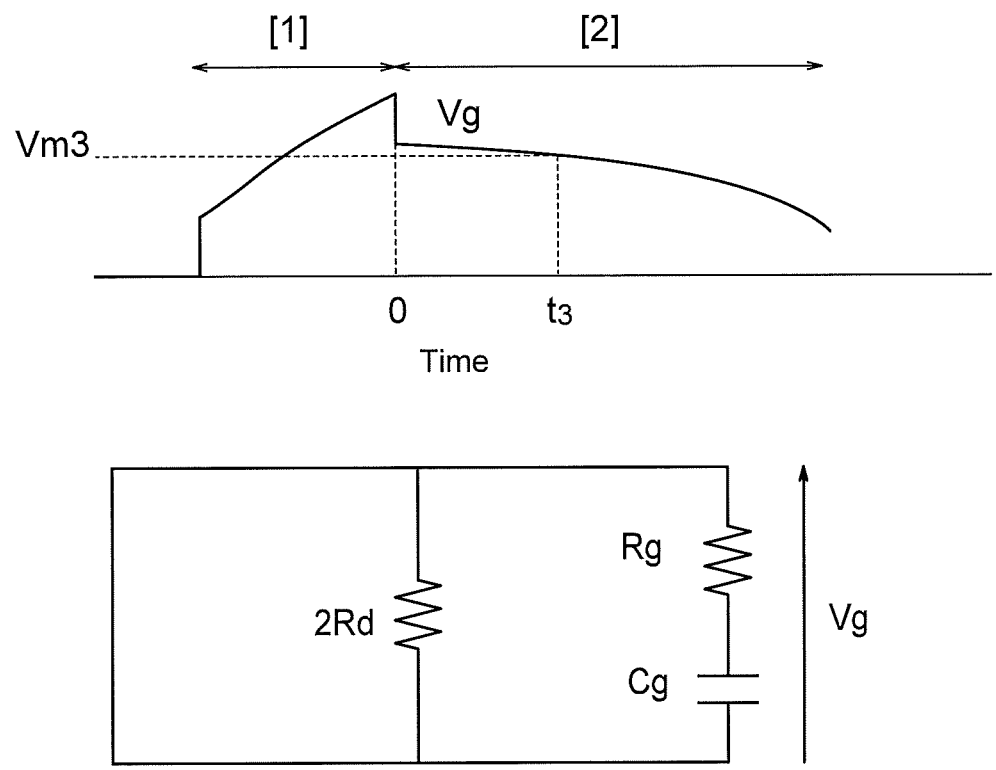
FIG. 13 is a diagram for explaining a specific example of a process of determining a gate resistance.

As shown in a graph on the upper side of FIG. 13, the one PMOS transistor (here, Mp0) is turned on and the pulse current is input in the third off period. After the input of the pulse current is completed, the corresponding one NMOS transistor (here, Mn0) operates in a linear region to discharge the charge. The NMOS transistors other than Mn0 are turned off. A voltage Vm3 is measured at a third time (t3) after the elapse of a third period from the start time (time 0)

of the discharge (a third sampling). The third period is equal to the first period, but may be different from the first period. The equivalent circuit at the time of discharging is illustrated on the lower side of FIG. 13. Since the number of PMOS transistors to be turned on is a half of that in the first and second periods, the drain resistance (on resistance) is 2Rd which is twice the drain resistance at the first and second samplings.

Figure 14:
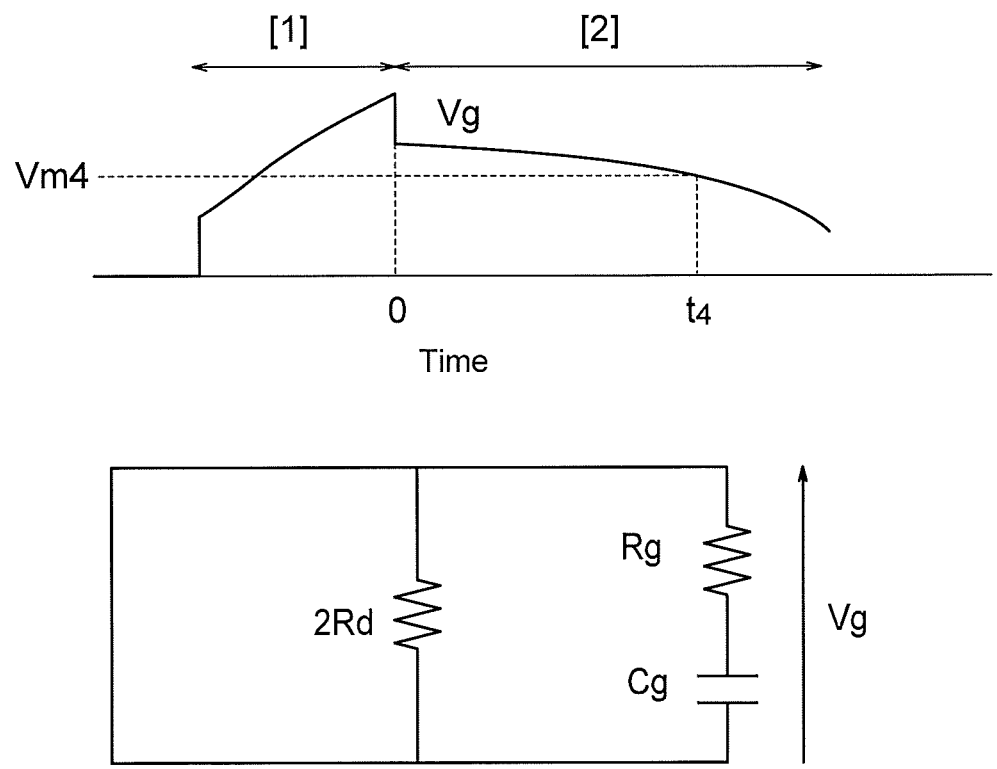
FIG. 14 is a diagram for explaining a specific example of a process of determining a gate resistance.

Similarly to the third off period, as shown in a graph on the upper side of FIG. 14, the one PMOS transistor (here, Mp0) is turned on and the pulse current is input in the fourth off period. After the input of the pulse current is completed, the corresponding one NMOS transistor (here, Mn0) operates in a linear region to discharge the charge. The NMOS transistors other than Mn0 are turned off. A voltage Vm4 is measured at a fourth time (t4) after the elapse of a fourth period from the start time (time 0) of the discharge (a fourth sampling). The fourth period is equal to the second period, but may be different from the second period. The fourth period is different from the third period. The equivalent circuit at the time of discharging is illustrated on the lower side of FIG. 14. Since the same transistor as the third sampling is used, the drain resistance at this time is also 2Rd.

The voltages Vm1 to Vm4 which are measured in the first to fourth off periods are represented by the following equations. "Qint" is a charge quantity accumulated in the parasitic capacitor at the start time of discharging.

$$V_{m1} = \frac{Q_{int} R_d e^{\frac{t1}{C(R_g+R_d)}}}{C(R_g + R_d)} \quad (2A)$$

$$V_{m2} = \frac{Q_{int} R_d e^{\frac{t2}{C(R_g+R_d)}}}{C(R_g + R_d)} \quad (2B)$$

$$V_{m3} = \frac{2 Q_{int} R_d e^{\frac{t3}{C(R_g+2R_d)}}}{C(R_g + 2R_d)} \quad (2C)$$

$$V_{m4} = \frac{2 Q_{int} R_d e^{\frac{t4}{C(R_g+2R_d)}}}{C(R_g + 2R_d)} \quad (2D)$$

Based on the equations (2A) to (2D), "Rg" and "Rd" are calculated by modifying the equations, performing the operations, and defining variables in order of the following equations (3A) to (3L).

$$t_1 = (CR_g + CR_d)\log\left(\frac{Q_{int} R_d}{(CR_g + CR_d)V_{m1}}\right) \quad (3A)$$

$$t_2 = (CR_g + CR_d)\log\left(\frac{Q_{int} R_d}{(CR_g + CR_d)V_{m2}}\right) \quad (3B)$$

$$t_3 = (CR_g + 2CR_d)\log\left(\frac{2Q_{int} R_d}{(CR_g + 2CR_d)V_{m3}}\right) \quad (3C)$$

$$t_4 = (CR_g + 2CR_d)\log\left(\frac{2Q_{int} R_d}{(CR_g + 2CR_d)V_{m4}}\right) \quad (3D)$$

$$t_2 - t_1 = CR_g \log\left(\frac{V_{m1}}{V_{m2}}\right) + CR_d \log\left(\frac{V_{m1}}{V_{m2}}\right) \quad (3E)$$

$$t_4 - t_3 = CR_g \log\left(\frac{V_{m3}}{V_{m4}}\right) + CR_d \log\left(\frac{V_{m3}^2}{V_{m4}^2}\right) \quad (3F)$$

$$V_{m21} = \log\left(\frac{V_{m1}}{V_{m2}}\right) \quad (3G)$$

$$V_{m43} = \log\left(\frac{V_{m3}}{V_{m4}}\right) \quad (3H)$$

$$t_2 - t_1 = CR_g V_{m21} + CR_d V_{m21} \quad (3I)$$

$$t_4 - t_3 = CR_g V_{m43} + 2CR_d V_{m43} \quad (3J)$$

$$R_g = -\frac{V_{m21}t_4 - V_{m21}t_3 - 2V_{m43}t_2 + 2V_{m43}t_1}{CV_{m21}V_{m43}} \quad (3K)$$

$$R_d = -\frac{V_{m21}t_4 - V_{m21}t_3 - V_{m43}t_2 + 2V_{m43}t_1}{CV_{m21}V_{m43}} \quad (3L)$$

Similarly to the first and second embodiments, the temperature of the semiconductor switching element can be calculated based on the information about the resistance and the temperature by using the calculated gate resistance Rg. Note that the calculation of Rd may be omitted.

Hereinafter, operation examples of the electronic circuit according to the present embodiment will be described.

At the measurement starting time in the first off period of the semiconductor switching element 2, the control circuit 31 of FIG. 7 turns on the two PMOS transistors (here, Mp0 and Mp1), and turns off the corresponding two NMOS transistors (here, Mn0 and Mn1) and all other NMOS transistors Mn2 to Mn5, to generate the pulse current. The control circuit 31 also turns on the NMOS transistor Mb. When the input of the pulse current is completed, the control circuit 31 turns off the above-described two PMOS transistors and controls so that the corresponding NMOS transistors operate in a linear region. All other NMOS transistors Mn2 to Mn5 remain in an off state. The charge stored in the parasitic capacitor by input of the pulse current is discharged through the NMOS transistors (here, Mn0 and Mn1). The control circuit 31 outputs a trigger signal to the sample hold circuit 12 at a first time (t1) after the elapse of the first period from the start time (0) of discharging. The sample hold circuit 12 measures the gate voltage in accordance with the trigger signal to obtain the voltage Vm1 at the time t1. The amplification circuit 13 amplifies the voltage Vm1, and the ADC 14 converts the amplified voltage Vm1 into a digital value (a first digital value) by AD conversion. The first digital value is input to the calculation circuit 35. When the measurement ending time is reached in the first off period, the control circuit 31 may perform a transition to a normal state in which all of the NMOS transistors Mn0 to Mn5 are turned on. When the first off period is completed, the control circuit 31 drives the semiconductor switching element 2 in the on period which follows the first off period. That is, the PMOS transistors Mp0 to Mp5 are turned on, and the NMOS transistors Mn0 to Mn5 are turned off. The NMOS transistor Mb is turned off. When the on period is completed, the PMOS transistors Mp0 to Mp5 are turned off, and the NMOS transistors Mn0 to Mn5 are turned on, thereby entering the second off period.

At the measurement starting time in the second off period, the control circuit 31 turns on the two PMOS transistors (here, Mp0 and Mp1), and turns off the corresponding two NMOS transistors (here, Mn0 and Mn1) and all other NMOS transistors Mn2 to Mn5, to generate the pulse current. The control circuit 31 also turns on the NMOS transistor Mb. When the input of the pulse current is completed, the control circuit 31 turns off the above-described two PMOS transistors and controls so that the corresponding NMOS transistors operate in a linear region. All other NMOS transistors Mn2 to Mn5 remain in an off state. The charge stored in the parasitic capacitor by input of the pulse current is discharged through the NMOS transistors (here, Mn0 and Mn1). The control circuit 31 outputs a trigger signal to the sample hold circuit 12 at a second time (t2) after the elapse of the second period from the start time (0) of discharging. The sample hold circuit 12 measures the gate voltage in accordance with the trigger signal to obtain the voltage Vm2 at the time t2. The amplification circuit 13 amplifies the voltage Vm2, and the ADC 14 converts the amplified voltage Vm2 into a digital value (a second digital value) by AD conversion. The second digital value is input to the calculation circuit 35. When the measurement ending time is reached in the second off period, the control circuit 31 may perform a transition to a state in which all of the NMOS transistors Mn0 to Mn5 are turned on. When the second off period is completed, the control circuit 31 drives the semiconductor switching element 2 in the on period which follows the second off period. That is, the PMOS transistors Mp0 to Mp5 are turned on, and the NMOS transistors Mn0 to Mn5 are turned off. The NMOS transistor Mb is turned off. When the on period is completed, the PMOS transistors Mp0 to Mp5 are turned off, and the NMOS transistors Mn0 to Mn5 are turned on, thereby entering the third off period.

At the measurement starting time in the third off period, the control circuit 31 turns on the one PMOS transistor (here, Mp0), and turns off the corresponding one NMOS transistor (here, Mn0) and all other NMOS transistors Mn1 to Mn5, to generate the pulse current. The control circuit 31 also turns on the NMOS transistor Mb. When the input of the pulse current is completed, the control circuit 31 turns off the above-described one PMOS transistor and controls so that the corresponding one NMOS transistor operates in a linear region. All other NMOS transistors Mn1 to Mn5 remain in an off state. The charge stored in the parasitic capacitor by input of the pulse current is discharged through the NMOS transistor (here, Mn0). The control circuit 31 outputs a trigger signal to the sample hold circuit 12 at a third time (t3) after the elapse of the third period from the start time (0) of discharging. The sample hold circuit 12 measures the gate voltage in accordance with the trigger signal to obtain the voltage Vm3 at the time t3. The amplification circuit 13 amplifies the voltage Vm3, and the ADC 14 converts the amplified voltage Vm3 into a digital value (a third digital value) by AD conversion. The third digital value is input to the calculation circuit 35. When the measurement ending time is reached in the third off period, the control circuit 31 may perform a transition to a normal state in which all of the NMOS transistors Mn0 to Mn5 are turned on. When the third off period is completed, the control circuit 31 drives the semiconductor switching element 2 in the on period which follows the third off period. That is, the PMOS transistors Mp0 to Mp5 are turned on, and the NMOS transistors Mn0 to Mn5 are turned off. The NMOS transistor Mb is turned off. When the on period is completed, the PMOS transistors Mp0 to Mp5 are turned off, and the NMOS transistors Mn0 to Mn5 are turned on, thereby entering the fourth off period.

At the measurement starting time in the fourth off period, the control circuit 31 turns on the one PMOS transistor (here, Mp0), and turns off the corresponding one NMOS transistor (here, Mn0) and all other NMOS transistors Mn1 to Mn5, to generate the pulse current. The control circuit 31 also turns on the NMOS transistor Mb. When the input of the pulse current is completed, the control circuit 31 turns off the above-described one PMOS transistor and controls so that the corresponding one NMOS transistor operates in a linear region. All other NMOS transistors Mn1 to Mn5 remain in an off state. The charge stored in the parasitic capacitor by input of the pulse current is discharged through the NMOS transistor (here, Mn0). The control circuit 31 outputs a trigger signal to the sample hold circuit 12 at a fourth time (t4) after the elapse of the fourth period from the start time (0) of discharging. The sample hold circuit 12 measures the gate voltage in accordance with the trigger signal to obtain the voltage Vm4 at the time t4. The amplification circuit 13 amplifies the voltage Vm4, and the ADC 14 converts the amplified voltage Vm4 into a digital value (a fourth digital value) by AD conversion. The fourth digital value is input to the calculation circuit 35. When the measurement ending time is reached in the fourth off period, the control circuit 31 may perform a transition to a normal state in which all of the NMOS transistors Mn0 to Mn5 are turned on. When the fourth off period is completed, the control circuit 31 drives the semiconductor switching element 2 in the on period which follows the fourth off period. That is, the PMOS transistors Mp0 to Mp5 are turned on, and the NMOS transistors Mn0 to Mn5 are turned off. The NMOS transistor Mb is turned off.

The calculation circuit 35 calculates the gate resistance Rg and the drain resistance Rd using the first to fourth digital values representing the voltages Vm1 to Vm4 according to the equation (3K) and the equation (3L). The calculation circuit 35 has a buffer therein, the buffer holding the information indicating the values of times t1 to t4, the capacitance of the parasitic capacitor, and the like which are required for the calculation of the equation (3K). Such information may be held in an external storage accessible from the calculation circuit 35. The calculation circuit 35 calculates the temperature Ts of the semiconductor switching element 2 based on the calculated gate resistance Rg and the information about the resistance and the temperature. The calculation circuit 35 can perform an arbitrary operation using the calculated temperature Ts of the semiconductor switching element 2. For example, the calculation circuit 35 predicts the life of the semiconductor switching element 2, and the life of a system on which the semiconductor switching element 2 is mounted. The calculation circuit 35 may output the information indicating the temperature Ts to an external device not illustrated. Note that the calculation circuit 35 may output the information indicating the calculated Rd to the external device. Although the calculation circuit 35 calculates both of the gate resistance Rg and the output resistance Rd, the calculation circuit 35 may calculate only the gate resistance Rg.

The third embodiment may be combined with the first embodiment or the second embodiment. In this case, the gate resistance or the temperature is calculated using the sampling of voltage in the period in which the pulse current is input in the first or second embodiment and the gate resistance or the temperature is calculated using sampling of voltage at the time of transient response in the third embodiment, to obtain a statistical value (for example, a mean value). The obtained value may be regarded as the gate resistance or the temperature of the semiconductor switching element 2.

According to the present embodiment, the gate resistance can be calculated with high accuracy even when the drain resistance Rd is an unknown variable.

According to the present embodiment, the measurement process is performed during the non-driving period of the semiconductor switching element 2, and therefore it is not necessary to stop the operation of the semiconductor switching element 2.

In the present embodiment, each PMOS transistor Mpx and each NMOS transistor Mnx have the same output resistance, but the output resistances are not necessarily all the same if the relationship among the output resistances of the respective PMOS transistors Mpx is made definite.

Although in the present embodiment, one sampling is performed in one off period, two samplings may be performed in one off period. For example, the samplings may be performed at the times t1 and t2 in the first off period, and the samplings may be performed at the times t3 and t4 in the second off period.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. An electronic circuit, comprising:
a plurality of first transistors;
a control circuit configured to selectively perform a first operation and a second operation,
  the first operation supplying a driving control signal to a gate terminal of a semiconductor switching element using the plurality of first transistors, and
  the second operation supplying a pulse current for measurement to the gate terminal using part of the plurality of first transistors;
a sample hold circuit configured to sample a voltage of the gate terminal during a period in which the pulse current is supplied to the gate terminal in the second operation; and
a calculation circuit configured to calculate a gate resistance of the semiconductor switching element based on the sampled voltage.

2. The electronic circuit according to claim 1, wherein
the control circuit is further configured to perform a first of the second operation and a second of the second operation,
the sample hold circuit is further configured to sample a voltage of the gate terminal at a first time after an elapse of a first period from a start of supply of the pulse current supplied in the first of the second operation,
the sample hold circuit is further configured to sample a voltage of the gate terminal at a second time after the elapse of a second period from a start of supply of the pulse current supplied in the second of the second operation, wherein the second period is different from the first period, and
the calculation circuit is further configured to calculate the gate resistance based on the voltages sampled at the first time and the second time.

3. The electronic circuit according to claim 2, wherein the calculation circuit is further configured to calculate a value of the pulse current based on the voltages sampled at the first time and the second time.

4. The electronic circuit according to claim 1, further comprising:
a temperature sensor configured to detect a temperature of the electronic circuit, wherein the calculation circuit is further configured to calculate the gate resistance based on the temperature detected by the temperature sensor and the sampled voltage.

5. The electronic circuit according to claim 4, wherein
the calculation circuit is further configured to specify a pulse current value corresponding to the detected temperature using information associating between the temperature inside the electronic circuit and the pulse current value supplied to the gate terminal, and
the calculation circuit is further configured to calculate the gate resistance based on the specified pulse current value and the sampled voltage.

6. The electronic circuit according to claim 1, further comprising:
an analog to digital converter configured to convert the sampled voltage into a digital value,
wherein the calculation circuit is further configured to specify a value of the sampled voltage based on the digital value.

7. The electronic circuit according to claim 6, further comprising an amplifier configured to amplify the sampled voltage, the amplifier being provided between the sample hold circuit and the analog to digital converter.

8. The electronic circuit according to claim 1, wherein the calculation circuit is further configured to calculate a temperature of the semiconductor switching element based on the gate resistance.

9. An electronic circuit, comprising:
a plurality of first transistors;
a plurality of second transistors connected to the plurality of first transistors in series, respectively, connection nodes between the plurality of first transistors and the plurality of second transistors being electrically connected to a gate terminal of a semiconductor switching element;
a control circuit configured to control the first transistors and the second transistors,
  the control circuit supplying a pulse current for measurement to the gate terminal of the semiconductor switching element through at least one of the plurality of first transistors and
  the control circuit discharging a charge accumulated in a parasitic capacitor of the semiconductor switching element due to the pulse current through at least one of the plurality of second transistors;
a sample hold circuit configured to sample a voltage of the gate terminal during a discharge period of the charge; and
a calculation circuit configured to calculate a gate resistance of the semiconductor switching element based on the sampled voltage.

10. The electronic circuit according to claim 9, wherein
the control circuit is further configured to supply the pulse current through a first number of first transistors and discharge the charge through the first number of second transistors,
the sample hold circuit is further configured to sample the voltage at a first time after an elapse of a first period from a start of discharge of the charge,
the control circuit is further configured to supply the pulse current through the first number of first transistors and discharge the charge through the first number of second transistors,
the sample hold circuit is further configured to sample the voltage at a second time after the elapse of a second period from the start of discharge of the charge, the second period being different from the first period, the control circuit is further configured to supply the pulse current through a second number of first transistors, the second number being different from the first number, and discharge the charge through the second number of second transistors, the sample hold circuit is further configured to sample the voltage at a third time after the elapse of a third period from the start of discharge of the charge, the control circuit is further configured to supply the pulse current through the second number of first transistors, and discharge the charge through the second number of second transistors, the sample hold circuit is further configured to sample the voltage at a fourth time after the elapse of a fourth period from the start of discharge of the charge, the fourth period being different from the third period, and the calculation circuit is further configured to calculate the gate resistance based on the four sampled voltages.

11. The electronic circuit according to claim 10, wherein the second number is twice or a half of the first number.

12. The electronic circuit according to claim 10, wherein the third period is equal to the first period, and the fourth period is equal to the second period.

13. The electronic circuit according to claim 9, wherein the control circuit is further configured to supply a driving control signal to the gate terminal during a driving period of the semiconductor switching element.

14. The electronic circuit according to claim 13, wherein the control circuit is further configured to supply, during a non-driving period of the semiconductor switching element, the pulse current and discharge the charge.

15. The electronic circuit according to claim 9, further comprising:
an analog to digital converter configured to convert the sampled voltage into a digital value,
wherein the calculation circuit is further configured to specify a value of the sampled voltage based on the digital value.

16. The electronic circuit according to claim 15, further comprising an amplifier configured to amplify the sampled voltage, the amplifier being provided between the sample hold circuit and the analog to digital converter.

17. The electronic circuit according to claim 9, wherein the calculation circuit is further configured to calculate a temperature of the semiconductor switching element based on the gate resistance.

18. The electronic circuit according to claim 1, wherein
the sample hold circuit is further configured to sample voltages of the gate terminal at a first time and a second time different from the first time within a time of period for the second operation of the control circuit, and
the calculation circuit is further configured to calculate the gate resistance based on the voltages sampled at the first time and the second time.

19. The electronic circuit according to claim 9, wherein
the control circuit is further configured to supply the pulse current through a first number of first transistors and discharge the charge through the first number of second transistors,
the sample hold circuit is further configured to sample voltages of the gate terminal at a first time and a second time different from the first time within a discharge period of the charge,
the control circuit is further configured to supply the pulse current through a second number of first transistors, the second number being different from the first number, and discharge the charge through the second number of second transistors,
the sample hold circuit is further configured to sample voltages of the gate terminal at a third time and a fourth time different from the third time within a discharge period of the charge, and
the calculation circuit is further configured to calculate the gate resistance based on the voltages sampled at the first time, the second time, the third time, and the fourth time.

* * * * *